United States Patent [19]

Tseng et al.

[11] Patent Number: 5,741,730
[45] Date of Patent: Apr. 21, 1998

[54] FLEXIBLE IC LAYOUT METHOD

[75] Inventors: Hsin-Min Tseng; David Wang, both of Hsinchu, Taiwan

[73] Assignee: Holtek Microelectronics Inc., Hsinchu, Taiwan

[21] Appl. No.: 489,595

[22] Filed: Jun. 12, 1995

[51] Int. Cl.$^6$ .................... H01L 21/82; H01L 21/44
[52] U.S. Cl. .............................. 438/130; 438/599
[58] Field of Search .................. 437/34, 48, 51, 437/57; 257/203, 206, 207, 208, 210, 401, 390, 391, 392; 365/104, 185.17; 438/128, 129, 130, 598, 599, 600

[56] References Cited

U.S. PATENT DOCUMENTS

| | | | |
|---|---|---|---|
| 4,467,520 | 8/1984 | Shiotari | 257/391 |
| 4,701,778 | 10/1987 | Aneha et al. | 257/207 |
| 4,952,824 | 8/1990 | Kamuro | 326/45 |
| 4,980,861 | 12/1990 | Herdt et al. | 365/104 |
| 5,184,202 | 2/1993 | Uchida | 257/390 |
| 5,227,997 | 7/1993 | Kikuda et al. | 365/230.06 |
| 5,242,850 | 9/1993 | Tasaka | 437/48 |
| 5,418,179 | 5/1995 | Hotta | 437/56 |
| 5,429,958 | 7/1995 | Matlock | 437/56 |
| 5,470,774 | 11/1995 | Kunitou | 437/48 |
| 5,483,483 | 1/1996 | Choi et al. | 365/177 |

*Primary Examiner*—Brian Dutton

[57] ABSTRACT

The present invention is related to a flexible IC layout method utilized for an IC having a plurality of logic gates in a first direction connected with a plurality of logic gates in a second direction wherein each of the logic gates has at least one polysilicon region and each of the logic gates in the first direction has an output serving as an input of a corresponding one of the logic gates in the second direction, which includes a step of forming input terminals for the logic gates by ion implantation. The present invention is flexible because the addition or deduction of the number of the input terminals according to the present invention can be achieved by ion implantation.

6 Claims, 4 Drawing Sheets

FLEXIBLE IC LAYOUT METHOD

FIELD OF THE INVENTION

The present invention is related to a layout method, and more particularly to an IC layout method.

BACKGROUND OF THE INVENTION

Please refer to FIG. 1 which schematically shows four NAND gates Y1, Y2, Y3 and Y4 in the Y direction, and four NAND gates X1, X2, X3 and X4 in the X direction. The outputs Y01, Y02, Y03 and Y04 of the gates Y1~Y4 respectively serve as the inputs of the gates X1~X4. The NAND gates in the Y direction may have various numbers of input terminals. For example, as shown in FIG. 1, the gate Y1 has two input terminals YI1 and YI2, and the gates Y2, Y3 and Y4 have two (YI1, YI2), three (YI1, YI2, YI3) and four (YI1, YI2, YI3, YI4) input terminals, respectively. Likewise, the NAND gates in the X direction may also have various numbers of input terminals. In the example shown in FIG. 1, the gates X1~X4 respectively have two (Y01, Y02), two (Y01, Y02), three (Y01, Y02, Y03) and four (Y01, Y02, Y03, Y04) input terminals. The layout method utilizing the outputs of logic gates in the Y direction to serve as the inputs of logic gates in the X direction is most popular for the circuitry of an encoder or a decoder.

The conventional layout method is described hereinafter by giving the layout shown in FIG. 1 for example. Two cells each of which has two input terminals (FIG. 2A), one cell having three input terminals (FIG. 2B) and one cell having four input terminals (FIG. 2C) are used to serve as the gates Y1, Y2, Y3 and Y4. The same types of cells are applied to serve as the gates X1, X2, X3 and X4. Then, all of the cells are interconnected according to a certain rule.

From the aforementioned method which chooses a plurality of appropriate cells and interconnects the cells, it is obvious that the number of the input terminals in each of the gates in the conventional layout method cannot be flexibly changed after the layout has been set up. If the input terminal number of any of the gates needs to be changed, the corresponding cell in place has to be picked out of and a new cell is placed onto the circuit board. For example, if the gate Y1 having two input terminals is to be changed into one having four input terminals, the corresponding cell as shown in FIG. 2A has to be replaced by a cell as shown in FIG. 2C. However, there may be no vacancy for additional four input terminals in the original IC layout circuitry or the IC layout circuitry has to be altered to accommodate the additional input terminals. In short, the conventional layout method lacks flexibility.

SUMMARY OF THE INVENTION

An object of the present invention is to provide a flexible IC layout method.

In accordance with the present invention, a flexible IC layout method utilized for an IC having a plurality of logic gates in a first direction connected with a plurality of logic gates in a second direction wherein each of the logic gates has at least one polysilicon region and each of the logic gates in the first direction has an output serving as an input of a corresponding one of the logic gates in the second direction, includes a step of forming input terminals for the logic gates by ion implantation.

In accordance with another aspect of the invention, the logic gates in the first direction have metal layers thereof connected to the at least one polysilicon regions of the logic gates in the second direction. The first direction is perpendicular to the second direction.

In accordance with another aspect of the invention, each of the at least one polysilicon regions of the logic gates is a region capable of serving as an input terminal. The logic gates include PMOS transistors and NMOS transistors. Each of the logic gates in each direction includes at least one PMOS transistor and at least one NMOS transistor, and each of the transistors includes a polysilicon region. The polysilicon region of the PMOS transistor processed by $p^+$ implantation serves as a valid input terminal. The polysilicon region of the NMOS transistor provided with an $n^+$ buried layer serves as an invalid input terminal. A number of the valid input terminals formed on the PMOS transistors is equal to that formed on the NMOS transistors.

In accordance with another aspect of the present invention, the logic gates are NAND gates.

BRIEF DESCRIPTION OF THE DRAWING

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
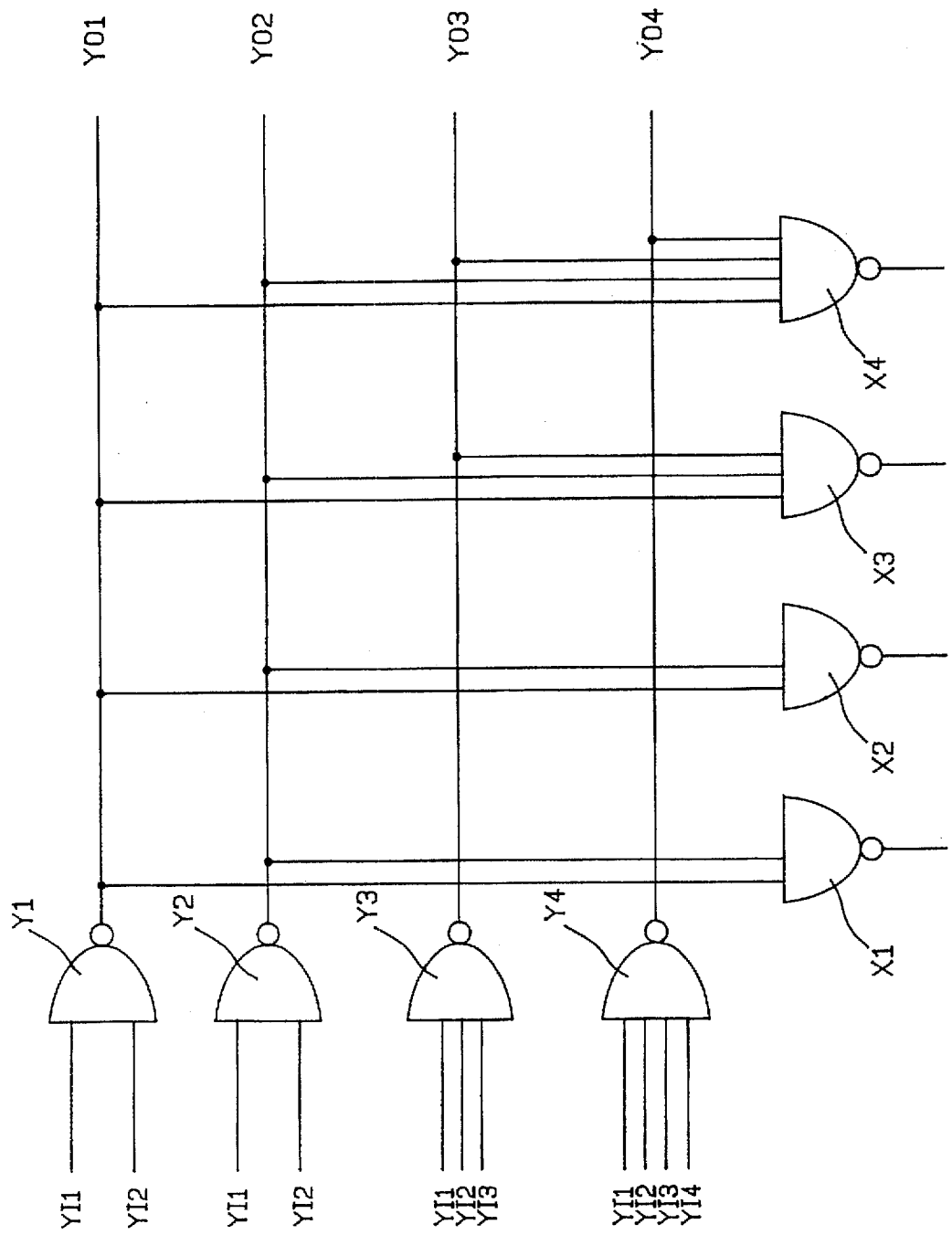
FIG. 1 is a schematic conventional logic circuit used in a conventional encoder or decoder.
Figure 2A:
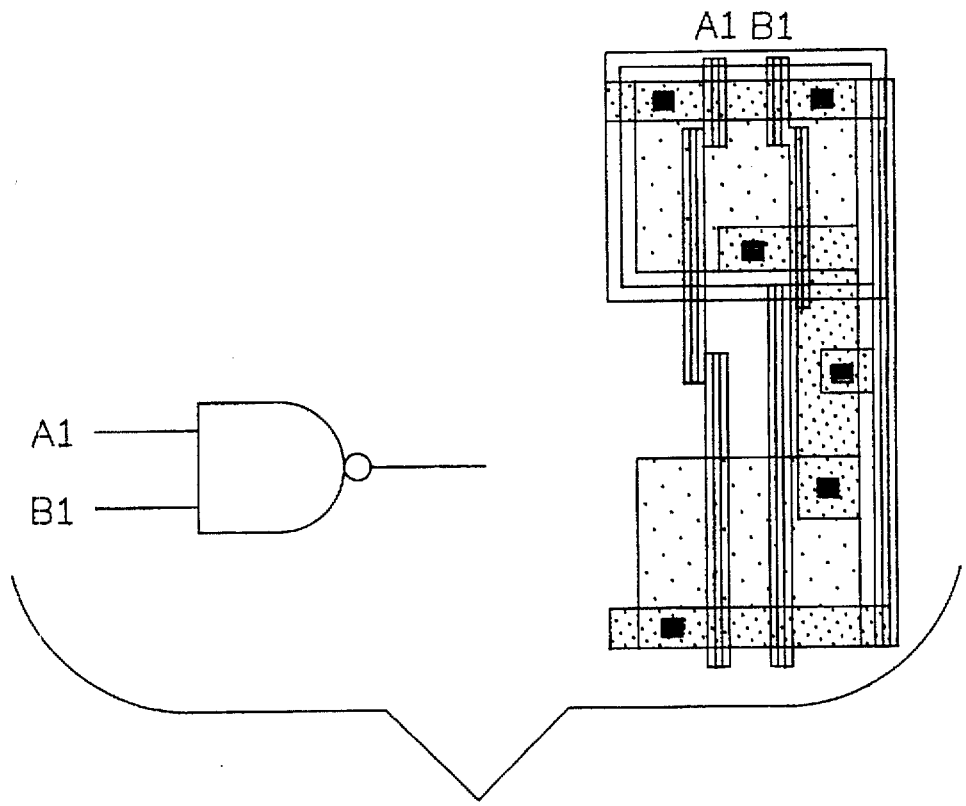
FIGS. 2A~2C are schematic diagrams respectively showing cells having various numbers of input terminals and used in a conventional layout method.
Figure 2B:
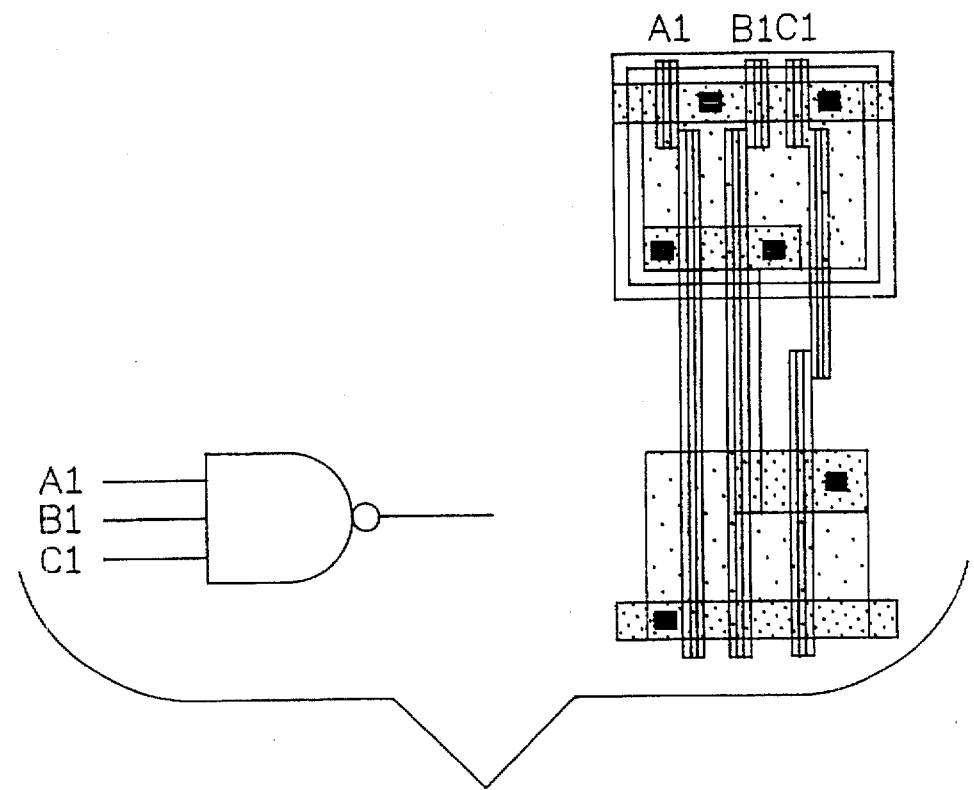
Figure 2C:
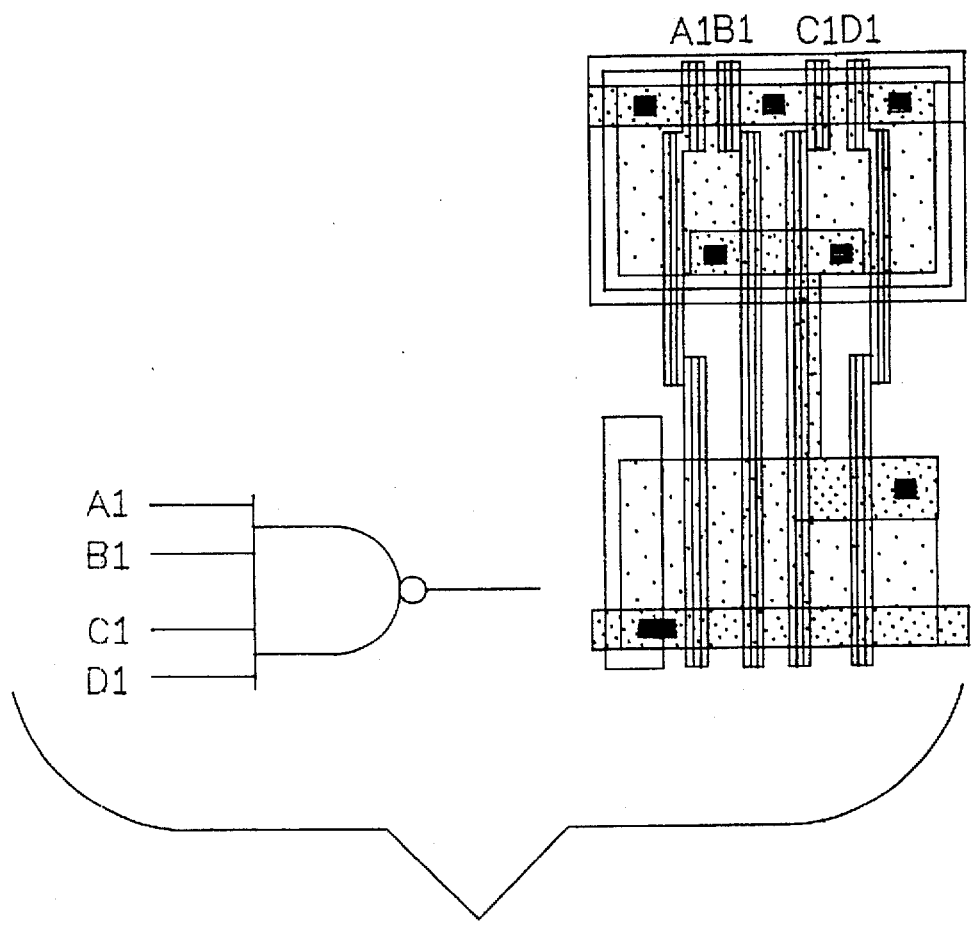
Figure 3:
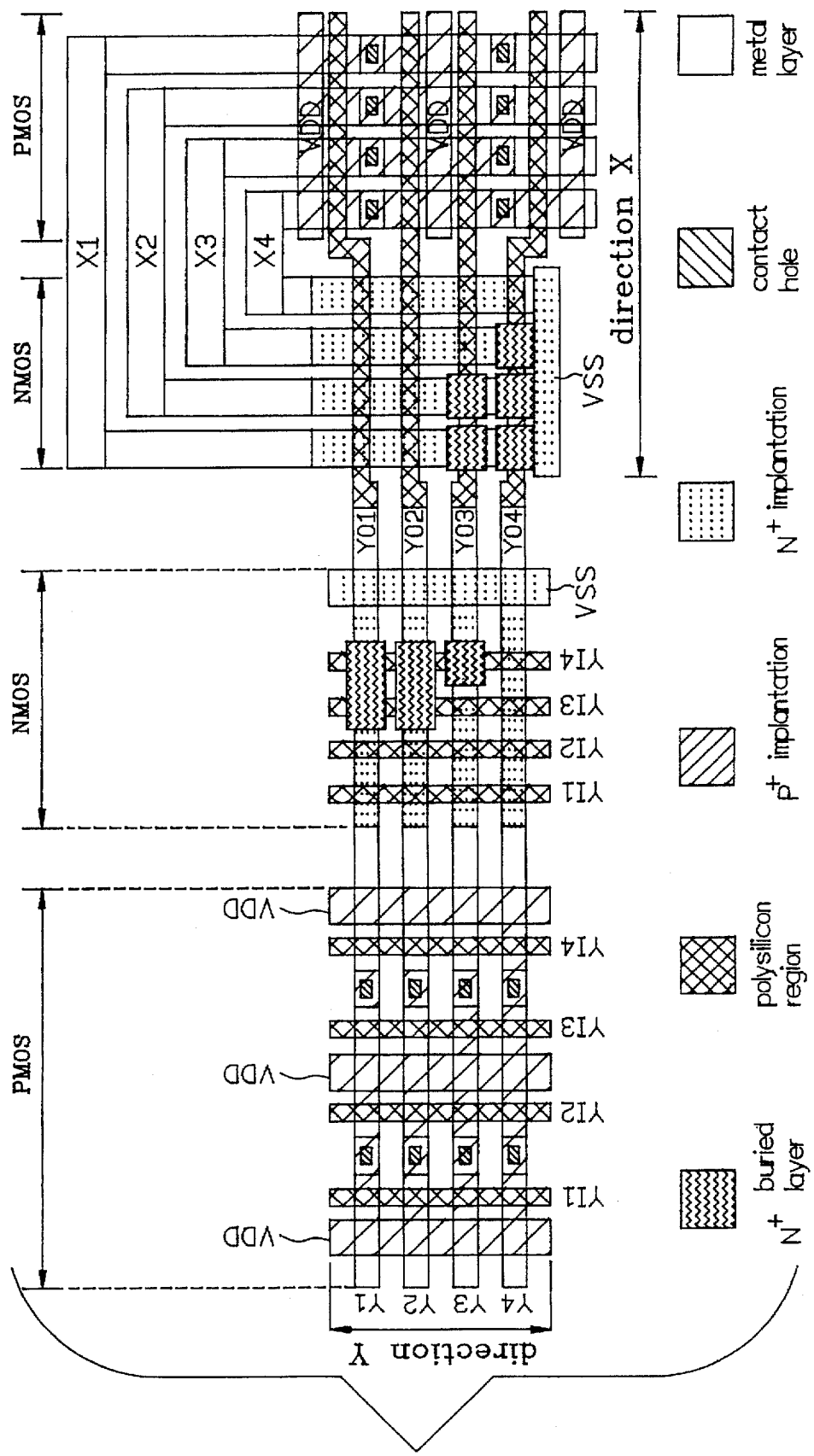
FIG. 3 is a schematic diagram showing a preferred embodiment of an IC layout according to the present invention.

Please refer to FIG. 3 which is a schematic diagram showing a preferred embodiment of an IC layout according to the present invention. The IC layout includes a plurality of NAND gates in the Y direction connected with a plurality of NAND gates in the X direction. The NAND gates in the Y direction have the metal layers thereof connected to the at least one polygate layers of the NAND gates in the X direction. The Y direction is perpendicular to the X direction. Each of the NAND gates in the Y direction has an output serving as an input of a corresponding one of the NAND gates in the X direction, and the formation of the input terminals for the NAND gates is achieved by ion implantation.

Each of the at least one polysilicon regions of the NAND gates is a region capable of serving as an input terminal. Each of the NAND gates in each direction includes PMOS transistors and NMOS transistors, and each of the transistors includes a polysilicon region. In a PMOS transistor, a valid input terminal can be made by having the polysilicon region that is on the metal layer of the PMOS transistor processed by $p^+$ implantation. In an NMOS transistor, an invalid input terminal can be provided by applying to the polysilicon region of the NMOS transistor an $n^+$ buried layer. Of course, the polysilicon regions of the NMOS transistors without applying thereto any $n^+$ buried layer serve as valid input terminals. A number of the valid input terminals formed on the PMOS transistors should be equal to that formed on the NMOS transistors.

In each of the X and the Y directions, the number of polysilicon regions of each gate is set to be equal to the number of input terminals of a gate having the most input terminals. In this preferred embodiment, the gate Y4 needs the most input terminals, 4 terminals, so each gate is set to have four polysilicon regions for choice.

As shown in FIG. 3, the gate Y1 has four polysilicon regions for serving as input terminals, but only two input terminals are required here. Thus, the first and the second polysilicon regions of the PMOS transistors of the gate Y1 are processed by $p^+$ implantation to produce the required two valid input terminals YI1 and YI2. On the other hand, the third and the fourth polysilicon regions of the NMOS transistors of the gate Y1 are provided with $n^+$ buried layers to mate YI3 and YI4 invalid and the other two polysilicon regions are left unprocessed to produce the required two valid input terminals YI1 and YI2. Likewise, the first and the second polysilicon regions of the PMOS transistors of the gate Y2 are processed by $p^+$ implantation to produce the required two valid input terminals YI1 and YI2. The third and the fourth polysilicon regions of the NMOS transistors of the gate Y2 are provided with $n^+$ buried layers to make YI3 and YI4 invalid and the other two polysilicon regions are left unprocessed to produce the required two valid input terminals YI1 and YI2. The $n^+$ buried layer will conduct the drain and the source and thus disable the gate. This is why the inputs YI3 and YI4 are interrupted and made invalid by a $n^+$ buried layer. Three valid input terminals YI1, YI2 and YI3 are produced by applying $p^+$ implantation to the first, the second and the third polysilicon regions of the PMOS transistors of the gate Y3. The fourth polysilicon region of the NMOS transistor of the gate Y3 is provided with $n^+$ buried layers to make YI4 invalid and the other three polysilicon regions are left unprocessed to produce the required three valid input terminals YI1, YI2 and YI3. All the four polysilicon regions of the PMOS transistors of the gate Y4 are processed by $p^+$ implantation to make the input terminals YI1~YI4 valid and none of the polysilicon regions of the NMOS transistors of the gate Y4 is provided with the $n^+$ buried layer so that the four terminals YI1~YI4 of the NMOS transistors are valid input terminals.

In the X direction, the gate X1 needs two valid input terminals Y01 and Y02, so the two polysilicon regions of the PMOS transistors of the gate X1 serving as the input terminals Y01 and Y02 are processed by $p^+$ implantation to produce the required two valid input terminals Y01 and Y02. On the other hand, the two polysilicon regions of the NMOS transistors of the gate X1 serving as the input terminals Y03 and Y04 are provided with $n^+$ buried layers to make Y03 and Y04 invalid and the other two polysilicon regions are left unprocessed to produce the required two valid input terminals Y01 and Y02. Likewise, the first and the second polysilicon regions of the PMOS transistors of the gate X2 are processed by $p^+$ implantation to produce the required two valid input terminals Y01 and Y02. The third and the fourth polysilicon regions of the NMOS transistors of the gate X2 are provided with $n^+$ buried layers to make Y03 and Y04 invalid and the other two polysilicon regions are left unprocessed to produce the required two valid input terminals Y01 and Y02. Three valid input terminals Y01, Y02 and Y03 are produced by applying $p^+$ implantation to the first, the second and the third polysilicon regions of the PMOS transistors of the gate X3. The fourth polysilicon region of the NMOS transistors of the gate X3 is provided with $n^+$ buried layers to make Y04 invalid and the other three polysilicon regions are left unprocessed to produce the required three valid input terminals Y01, Y02 and Y03. All the four polysilicon regions of the PMOS transistors of the gate X4 are processed by $p^+$ implantation to make the input terminals Y01~Y04 valid and none of the polysilicon regions of the NMOS transistors of the gate X4 is provided with the $n^+$ buried layer so that the four terminals Y01~Y04 of the NMOS transistors are valid input terminals.

To sum up, the present invention is a regular, flexible and convenient layout method. The present invention is more flexible than the prior art because the addition or deduction of the number of the input terminals according to the present invention can be achieved by ion implantation rather than by changing cells as in the prior art. By this method, an integral and regular logic circuit can be obtained While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A flexible IC layout method utilized for an IC having a plurality of logic gates in a first direction connected with a plurality of logic gates in a second direction wherein each of said logic gates has at least one polysilicon region and each of said logic gates in said first direction has an output serving as an input of a corresponding one of said logic gates in said second direction, comprising a step of forming input terminals for said logic gates by ion implanting said polysilicon region, wherein each of said logic gates includes a plurality of PMOS transistors and a plurality of NMOS transistors and each of said transistors has one said polysilicon region, wherein said polysilicon region of said PMOS transistor processed by $p^+$ implantation serves as a valid input terminal, said polysilicon region of said NMOS transistor provided with an $n^+$ buried layer serves as said invalid input terminal, and wherein the remaining polysilicon region of said NMOS transistor is a valid input terminal, and a number of said valid input terminals formed on said at least one PMOS transistor is equal to a number of said valid input terminals formed on said at least one NMOS transistor.

2. A method according to claim 1 wherein said logic gates in said first direction have metal layers thereof connected to said at least one polysilicon regions of said logic gates in said second direction.

3. A method according to claim 1 wherein said first direction is perpendicular to said second direction.

4. A method according to claim 1 wherein each of said at least one polysilicon regions of said logic gates is a region capable of serving as one of said input terminals.

5. A method according to claim 4 wherein said logic gates include PMOS transistors and NMOS transistors.

6. A method according to claim 1 wherein said logic gates are NAND gates.

* * * * *